United States Patent
Cheng et al.

(10) Patent No.: US 7,663,908 B2
(45) Date of Patent: Feb. 16, 2010

(54) METHOD FOR INCREASING RETENTION TIME IN DRAM

(75) Inventors: Hank Cheng, Taichung (TW); Chen-Hui Hsieh, Chu-Pei (TW); Chung-Cheng Chou, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 399 days.

(21) Appl. No.: 11/684,803

(22) Filed: Mar. 12, 2007

(65) Prior Publication Data

US 2008/0225616 A1  Sep. 18, 2008

(51) Int. Cl.
*G11C 11/24* (2006.01)

(52) U.S. Cl. .................... 365/149; 365/203; 365/104

(58) Field of Classification Search .............. 365/149, 365/203, 104, 63, 72, 222, 233, 230.08, 189.05, 365/191
See application file for complete search history.

(56) References Cited

U.S. PATENT DOCUMENTS

| | | | |
|---|---|---|---|
| 5,659,260 A | 8/1997 | Kajimoto et al. | |
| 6,205,049 B1 | 3/2001 | Lien et al. | |
| 6,411,160 B1 * | 6/2002 | Riho et al. | 327/565 |
| 6,728,151 B2 | 4/2004 | Joo | |
| 6,961,278 B2 * | 11/2005 | Jeong | 365/222 |
| 2003/0174533 A1 | 9/2003 | Ito | |
| 2007/0133327 A1 * | 6/2007 | Huang | 365/207 |
| 2007/0268764 A1 | 11/2007 | Kim et al. | |

FOREIGN PATENT DOCUMENTS

KR  2002045959 A  *  6/2002

* cited by examiner

*Primary Examiner*—Dang T Nguyen
(74) *Attorney, Agent, or Firm*—Duane Morris LLP (57) ABSTRACT

The disclosure generally relates to a method and apparatus for decreasing the frequency of refreshing a memory cell in communication with a word line and a bit line. A method according to one embodiment includes: providing a DRAM circuit having a memory cell, a sense amplifier including a pre-charge circuit connected to a first voltage source and a back-to-back inverter including a first NMOS transistor having a source, a second NMOS transistor having a source, a first PMOS transistor having a source and a second PMOS transistor having a source; maintaining the voltage of the sources of the first and second PMOS transistors at a first voltage during normal operation; and raising the voltage of the sources of the first and second PMOS transistors from the first voltage to a second voltage during a refresh operation.

16 Claims, 5 Drawing Sheets

METHOD FOR INCREASING RETENTION TIME IN DRAM

FIELD OF THE INVENTION

The invention relates to circuits and more specifically to DRAM memory circuit.

BACKGROUND

In a dynamic random access memory ("DRAM"), data is stored as a logic high value (e.g., "1") or logic low value (e.g., "0") by the presence or absence of charge on a capacitor within an individual memory cell. After the data has been stored as a charge on the capacitor, the charge gradually leaks off and the data becomes corrupted. Therefore, a "refresh" cycle must be performed before sufficient time passes for the data to become corrupt, to maintain the integrity of the data. The frequency at which the memory cell needs to be refreshed depends upon several factors including the quality of the signal, i.e., the amount of charge on the capacitor that is able to be stored in memory. For example, if a logic "1" value is being stored, the quality of signal is dependent upon the amount of charge placed on the capacitor during the write operation. The greater the amount of charge on the capacitor, the higher the quality of the "1" signal. In contrast, if a "0" is being stored in memory, the signal is of higher quality if there is no charge on the capacitor. A higher quality of the signal enables the memory cell to be refreshed less frequently which ultimately leads to less power consumption and less data corruption.

To refresh data from a memory array, the array is typically placed in a read mode to obtain the data currently stored in a row of memory cells. Subsequently, these data are used as new input data that are re-written into the row of memory cells, thus maintaining the stored data.

Figure 1:
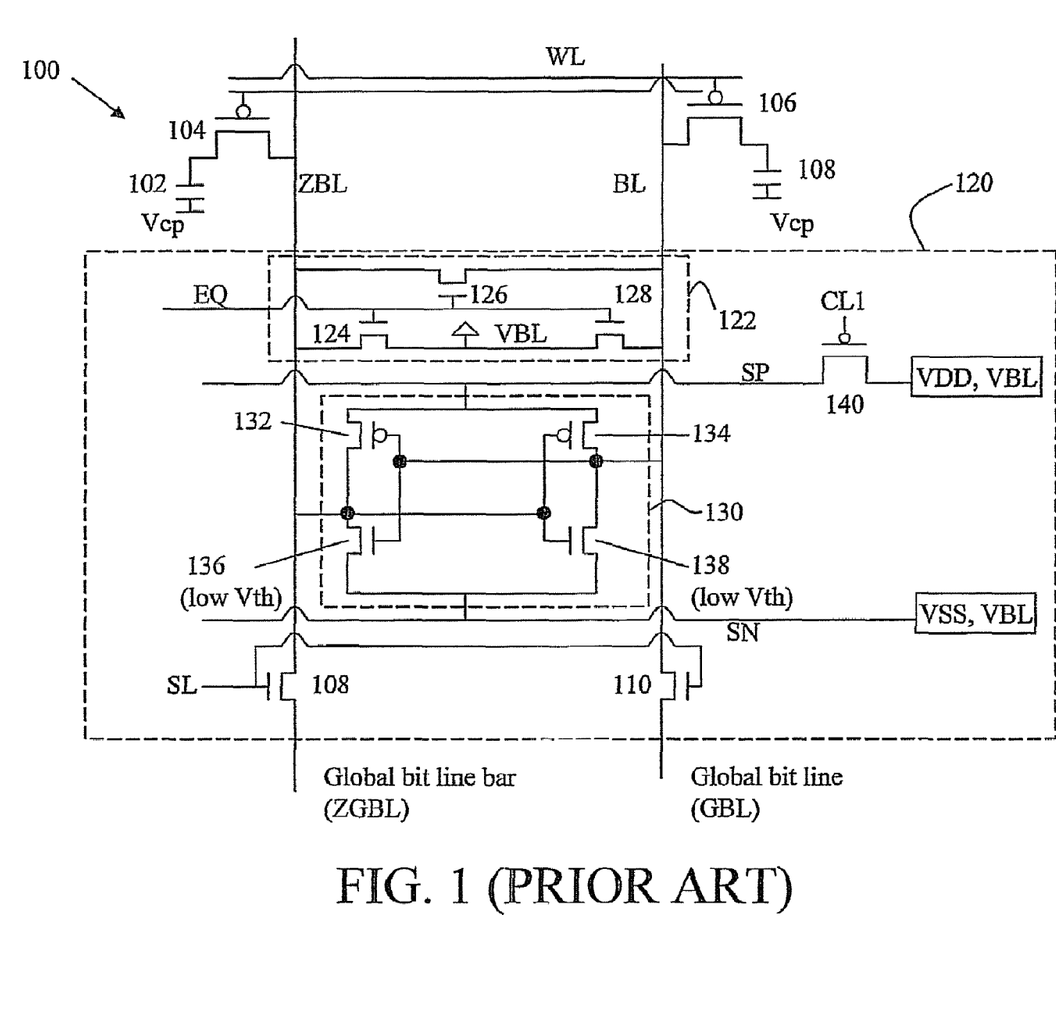
FIG. 1 illustrates a prior art DRAM circuit.

FIG. 1 illustrates a prior art DRAM circuit 100 having a first bit cell 108 and a second bit cell 102. The value stored in the first bit cell 108 is passed to the bit line BL through PMOS transistor 106. The value stored in the second bit cell 102 is passed to the bit line bar ZBL through PMOS transistor 104. The first and second PMOS transistors 106, 104 are coupled to sense amplifier 120. Sense amplifier 120 includes a pre-charge circuit 122, a back-to-back inverter 130 and two NMOS transistors 108, 110, which have their gates tied to column selection line SL. Pre-charge circuit 122 is comprised of three NMOS transistors 124, 126, 128, each of which has its gate tied to equalization line EQ.

Back-to-back inverter 130 is a conventional cross-coupled CMOS inverter comprising two PMOS transistors 132, 134 and two NMOS transistors 136, 138, NMOS transistors 136 and 138 have low threshold voltages for reasons discussed below. The gates of NMOS transistor 138 and PMOS transistor 134 are tied together and coupled to both the bit line bar ZBL and the drains of NMOS transistor 136 and PMOS transistor 132, which are also tied together. The gates of NMOS transistor 136 and PMOS transistor 132 are tied together and coupled to the bit line BL and the drains of NMOS transistor 138 and PMOS transistor 134, which are also tied together. The sources of PMOS transistors 132 and 134 are tied together and connected to high voltage source $V_{DD}$ via line SP and PMOS transistor 140, which has its gate tied to control line CL1. The sources of the NMOS transistors 136 and 138 are also tied together and connected to $V_{SS}$, which is set at ground, via line SN.

The refreshing of a "1" in the first bit 108 of prior art DRAM circuit 100 is now discussed. Initially, circuit 100 is in the "normal operation" mode, where the circuit 100 is not refreshing, reading or writing. In this mode, equalization line EQ is coupled to a logic "1" signal, which turns on the three NMOS transistors 124, 126, 128 of pre-charge circuit 122 and pre-charges ZBL and BL to the voltage of $V_{BL}$. $V_{BL}$ is approximately half the voltage (relative to $V_{SS}$) of $V_{DD}$. Also in this mode, back-to-back inverter 130 is off as CL1 has a high voltage signal connected to it, turning off PMOS transistor 140. Next, the refresh mode begins by transitioning the voltage on equalization line EQ from a high voltage to a low voltage, causing lines ZBL and BL to float at approximately $V_{BL}$. Additionally, PMOS transistor 106 is turned on by transitioning word line WL from a high voltage to a low voltage. The voltage of the first bit 108 is then coupled to BL. Since BL has a bit line capacitance that is larger than the capacitance of capacitor 108, the voltage of BL is pulled up slightly.

Next, back-to-back inverter 130 is turned on by transitioning the voltage on control line CL1 from a high voltage to a low voltage, thereby turning on PMOS transistor 140 and coupling line SP to $V_{DD}$. When sense amplifier 130 is turned on, the voltage on bit line BL is pulled up via PMOS transistor 134, and the voltage of bit line bar ZBL is pulled down via NMOS transistor 136.

Figure 2:
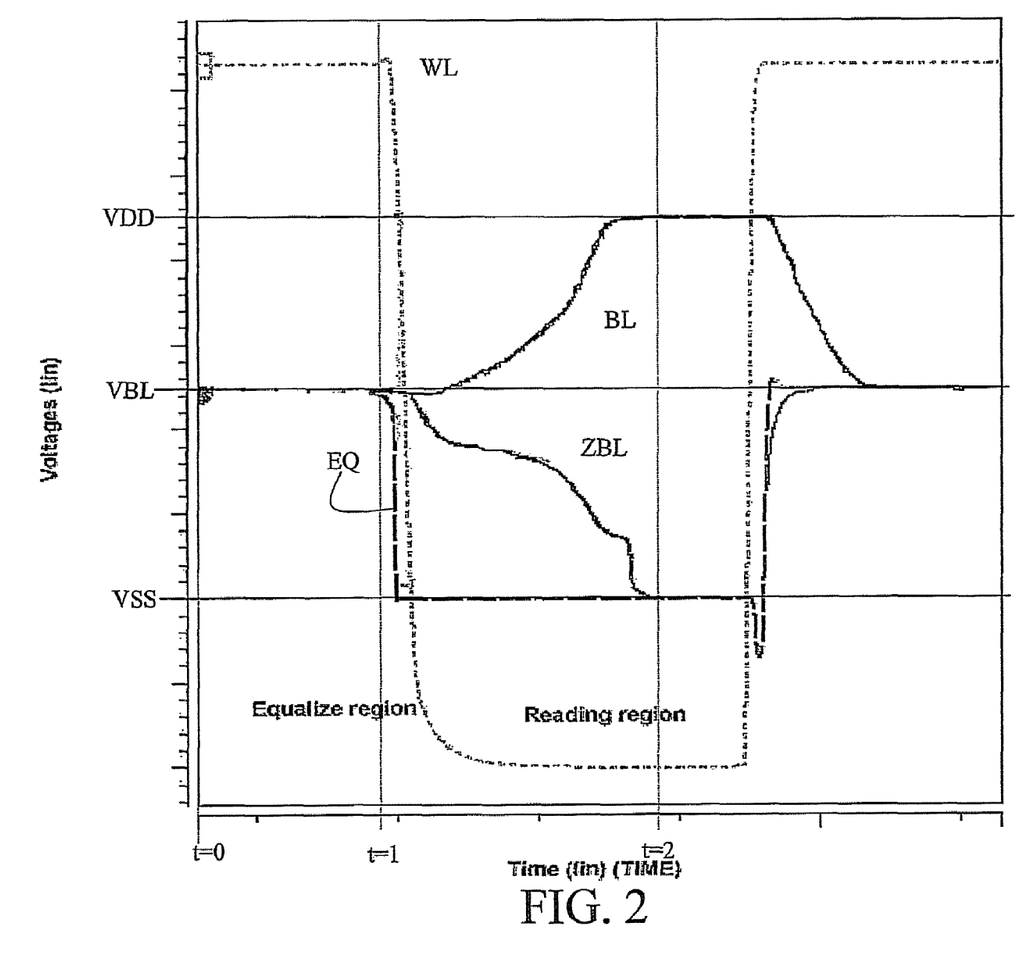
FIG. 2 is a voltage-versus-time graph of the refresh cycle of a prior art DRAM circuit.

FIG. 2 is a diagram showing voltage versus time and illustrates certain signals of DRAM circuit 100 as they transition during the normal operating phase and the refresh phase. Of particular interest are the signals of lines BL and ZBL as they illustrate the slow transitioning from their initial voltage level at $V_{BL}$ at time t=1 to their respective voltage levels at $V_{DD}$ and $V_{SS}$ at time t=2. As illustrated in FIG. 2, the transition of both BL and ZBL from their initial voltage to their final voltages is slow, as the slopes of the lines indicate a gradual transition, Because it is difficult to completely pull the voltage of the capacitor 108 to its maximum voltage by turning on the back-to-back inverter by lines SN and SP, the frequency for refreshing the PMOS transistor 106 must be increased so the data stored in the capacitor 108 is retained, Similar problems exist with regards to refreshing a "0" value in bit cell 108. The sequence of refreshing a "0" in bit 108 is similar to the process described above with regards to refreshing a logic "1" in bit cell 108. When a logic "0" is being refreshed, it is difficult to remove all of the charge from capacitor 108. Therefore, the frequency of refreshing the bit must be increased.

To help increase the ability of $V_{SS}$ to pull down the voltage on line BL during the refreshing phase of a "0" in storage bit 108, NMOS transistors 136, 138 are typically low threshold voltage transistors. Manufacturing circuits with different threshold voltages requires additional manufacturing processing, as all of the transistors of the circuit cannot be formed by the same steps. The additional manufacturing steps, such as additional photolithographic steps, drive up the time and cost of production.

Therefore, it is desirable in the art to provide an improved apparatus and method.

SUMMARY OF THE INVENTION

An improved DRAM circuit and a method for increased retention time in DRAM circuits are described herein. In one embodiment, the DRAM circuit comprises at least one memory cell comprising a capacitor, a transistor and at least one sense amplifier. The at least one sense amplifier comprises a pre-charge circuit and a back-to-back inverter. The back-to-back inverter includes at least one PMOS transistor and at least one NMOS transistor, wherein a source of the at least one NMOS transistor is coupled to a first voltage source set at ground and a source of the at least one PMOS transistor coupled to a switch. The switch is operable to connect the source of the at least one PMOS transistor to one of a second voltage source set above ground and a third voltage source set at a higher voltage relative to the voltage of the second voltage source.

In another exemplary embodiment, the DRAM circuit comprises at least one memory cell and at least one sense amplifier connected to the memory cell. The at least one sense amplifier includes a pre-charge circuit connected to a first voltage source and a back-to-back inverter connected to the pre-charge circuit. The back-to-back inverter includes a first PMOS transistor having a source, a second PMOS transistor having a source, a first NMOS transistor having a source and a second NMOS transistor having a source. The sources of the first and second NMOS transistors are connected to a second voltage source and the sources of the first and second PMOS transistors are configured to selectively connect to one of a third voltage source having a higher voltage than the voltage of the first voltage source and a fourth voltage source having a higher voltage than the third voltage source.

In another exemplary embodiment, the disclosure relates to a method of increasing the time between refreshing a DRAM circuit comprising the steps of providing a DRAM circuit having a memory cell, a sense amplifier including a pre-charge circuit connected to a first voltage source and a back-to-back inverter including a first NMOS transistor having a source, a second NMOS transistor having a source, a first PMOS transistor having a source and a second PMOS transistor having a source. The method further includes the steps of maintaining the voltage of the sources of the first and second PMOS transistors at a first voltage during normal operation and raising the voltage of the sources of the first and second PMOS transistors from the first voltage to a second voltage during a refresh operation.

DETAILED DESCRIPTION

This description of the exemplary embodiments is intended to be read in connection with the accompanying drawings, which are to be considered part of the entire written description.

Figure 3:
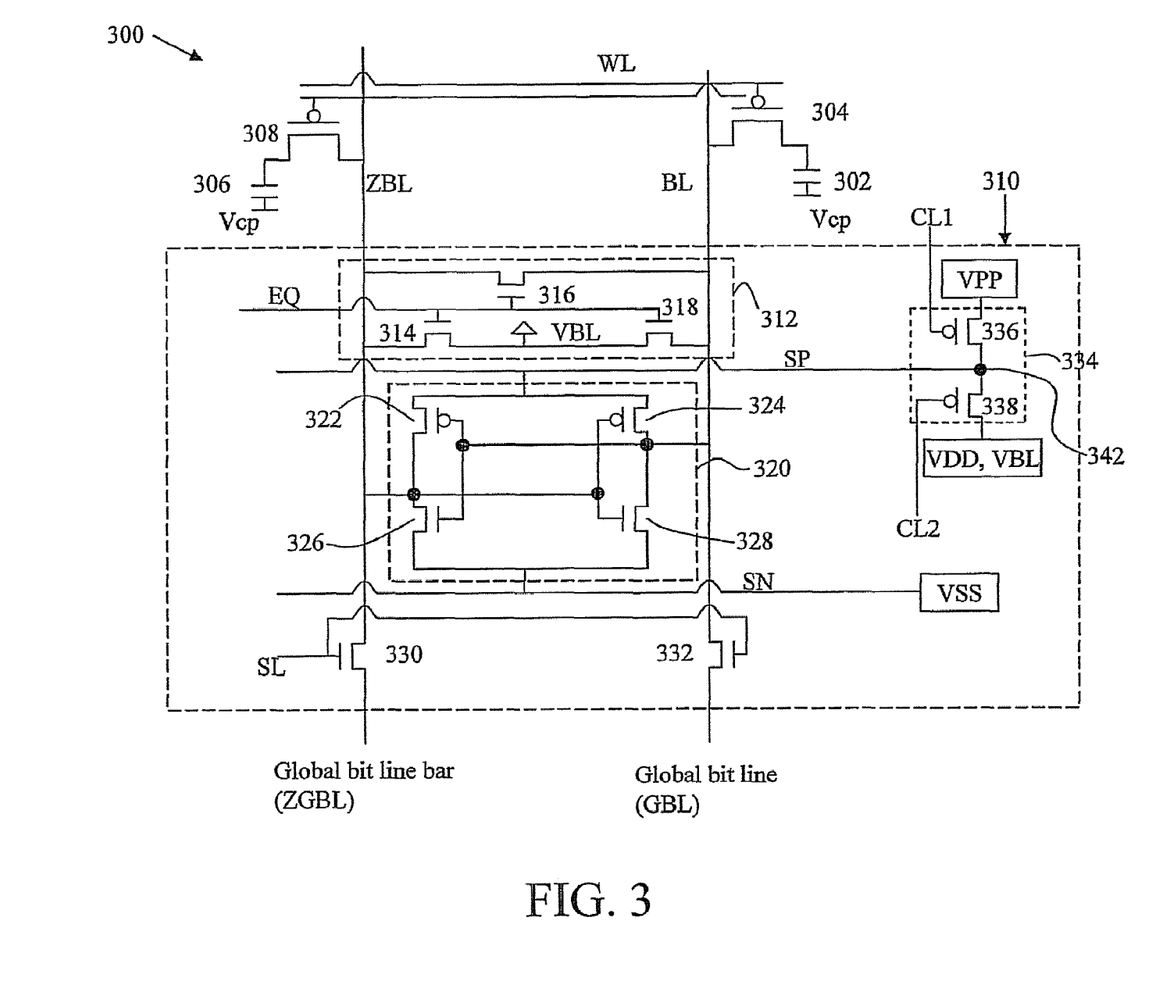
FIG. 3 illustrates a DRAM circuit according to an exemplary embodiment of the present invention.

FIG. 3 illustrates an exemplary DRAM circuit 300 according to one embodiment of the present invention. Note that a DRAM circuit generally includes multiple DRAM cells and various additional periphery circuitry (e.g., write circuitry, word line decoders, digital line decoders, additional equalization, and the like.). However, for the purposes of clarity and brevity additional DRAM cells and periphery circuitry are not shown or described herein.

DRAM circuit 300 includes a first storage bit 302 and a second storage bit 306, each connected to a PMOS transistor 304 and 308 respectively. PMOS transistor 308 is connected to bit line bar ZBL, and PMOS transistor 304 is coupled to bit line BL. Both lines ZBL and BL are connected to sense amplifier 310. Sense amplifier 310 includes a pre-charge circuit 312, a back-to-back inverter 320 and two NMOS transistors 330, 332. The gates of the NMOS transistors 330 and 332 are coupled to column selection line SL. Pre-charge circuit 312 includes three NMOS transistors 314, 316, 318, although other types of transistors could be used. The gate of each NMOS transistor 314, 316, 318 is coupled to the equalization line EQ.

Back-to-back inverter 320 is a cross-coupled CMOS inverter including two PMOS transistors 322, 324 and two NMOS transistors 326, 328. NMOS transistors 326 and 328 do not need to have low threshold voltages, and may be formed by the same process as all of the other transistors in the circuit. Because all of the transistors of the DRAM cell may be made by the same process, the time and expense of manufacturing is reduced because the extra photolithography steps required in circuits requiring special threshold voltages for the NMOS transistors may be eliminated. The gates of PMOS transistor 324 and NMOS transistor 328 are tied together and connected to both the line ZBL and the drains of PMOS transistor 322 and NMOS transistor 326, which are also coupled together. Likewise, the gates of PMOS transistor 322 and NMOS transistor 326 of back-to-back inverter 320 are tied together and connected to line BL and the drains of PMOS transistor 324 and NMOS transistor 328, which are also connected. The sources of the NMOS transistors 326 and 328 are tied together and coupled to $V_{SS}$ which is set at ground. The sources of the PMOS transistors 322 and 324 are tied together and coupled to a switch 334.

In a preferred embodiment, switch 334 is implemented using two PMOS transistors 336 and 338 whose gates are connected to control line CL1 and control line CL2 respectively. However, switch 334 may be implemented using different types of MOS transistors. Switch 334 is operable between two voltage sources $V_{DD}$ and $V_{PP}$.

$V_{DD}$ is a high voltage source and varies depending upon the application in which DRAM circuit 300 is being implemented. $V_{PP}$ is set to a voltage level higher than that of $V_{DD}$. In a preferred embodiment, $V_{PP}$ is set to approximately $V_{DD}$+0.2 volts to approximately $V_{DD}$+0.6 volts. However, the voltage range of $V_{DD}$+0.2 volts to $V_{DD}$+0.6 volts shall not be limiting, as those skilled in the art will appreciate that other suitable voltages for $V_{PP}$ may be used. For example, if a different value of $V_{DD}$ is selected for an integrated circuit, then a corresponding suitable value for $V_{PP}$ may readily be determined by one of ordinary skill in the art without undue experimentation. When the DRAM circuit 300 is in normal operation, the PMOS transistors of switch 334 are turned off by having a high voltage signal on control lines CL1 and CL2. During a read or refresh sequence, line SP is initially coupled to $V_{DD}$ and shortly thereafter is coupled to VPP as described below.

Figure 4:
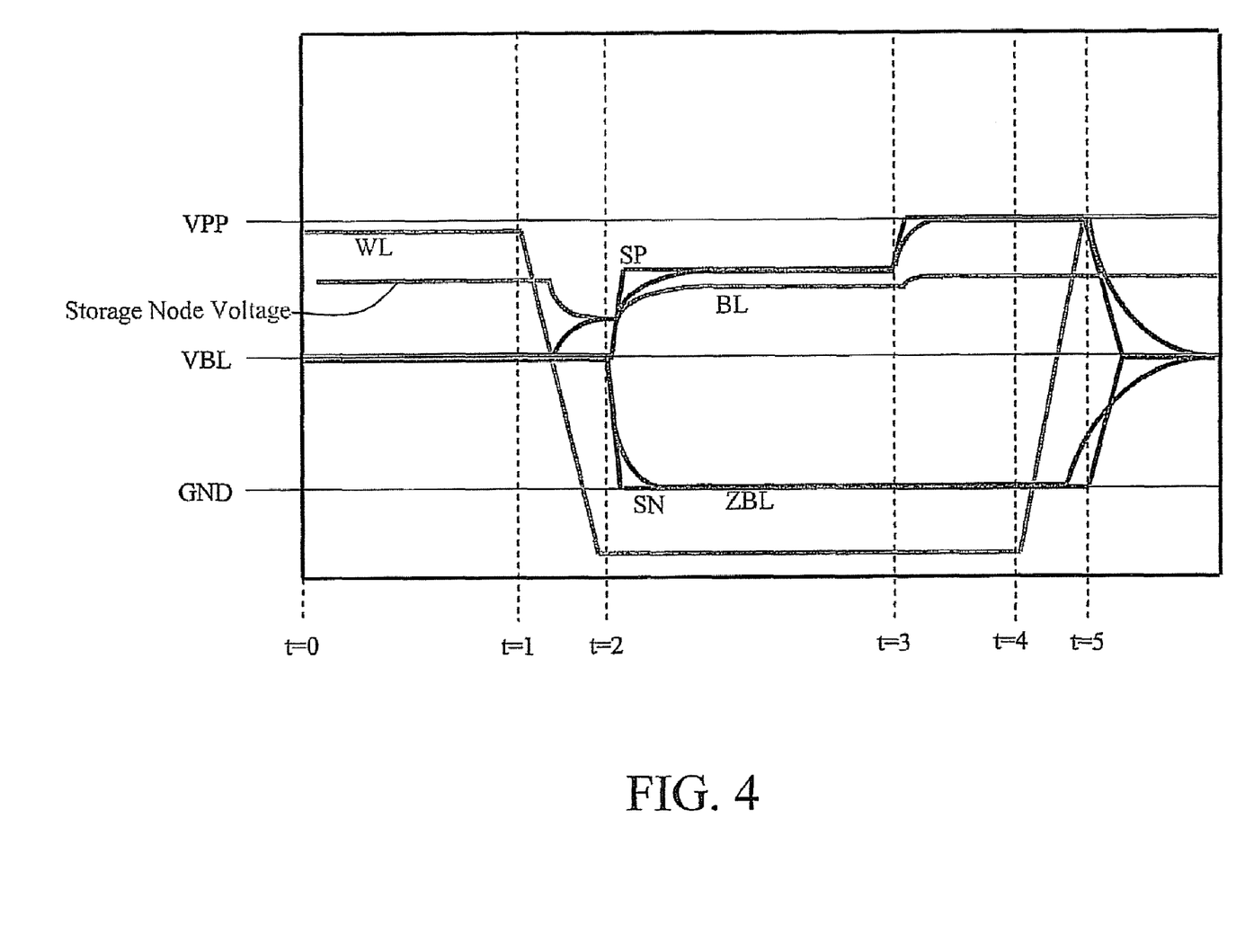
FIG. 4 illustrates a voltage versus time graph of the refresh cycle of the DRAM circuit of FIG. 3.

With reference to FIGS. 3 and 4, the refresh operation of a "1" in the first storage bit 302 of the exemplary DRAM circuit 300 is now described. Initially at time t=0, exemplary DRAM circuit 300 is in normal operation. In normal operation, no refreshing, writing or reading of either storage bit 302 or 306 is occurring, and the equalization line EQ is in a logic high state. The high state of line EQ turns on the three NMOS transistors 314, 316 and 318 of pre-charge circuit 312 and charges lines ZBL and BL with the voltage $V_{BL}$. Given a circuit in which $V_{SS}$ is 0.0 volts, the voltage $V_{BL}$ may generally be set from about $0.5V_{DD}$ to approximately $0.6V_{DD}$, although other voltages may be used. It is further understood that if $V_{SS}$ is not exactly zero, then $V_{BL}$ may be set between about $V_{SS}$+0.5($V_{DD}$–$V_{SS}$) and about $V_{SS}$+0.6($V_{DD}$–$V_{SS}$). When word line WL is turned off (during the equalization time from t=0 to t=1), bit line BL, bit line bar ZBL, node SN, and node SP are pulled to $V_{BL}$. All of the nodes of the back to back inverter 520 are also pulled to $V_{BL}$.

When a read or refresh function of the DRAM circuit is initiated at time t=1, line EQ is turned off by connecting it to a low voltage source or to ground. With line EQ set to a low signal, BL and ZBL begin to float at approximately $V_{BL}$. The signal of line WL is used to turn PMOS transistor 304 on, so the voltage of the connected capacitor 302 may be read. With the PMOS transistor 304 on, the signal stored in capacitor 304 begins to develop on line BL. Line SN maintains its connection with $V_{SS}$, and at time t=2, switch 334 couples line SP to $V_{DD}$ by transitioning the signal on control line CL2 from a high voltage to a low voltage turning on transistor 338. With transistor 338 turned on, $V_{DD}$ is connected to line SP at node 342, and all of the transistors of back-to-back inverter 320 are subsequently turned on.

A short time later at time t=3, control line CL1 transitions from a high voltage signal to a low voltage signal turning on transistor 336, and control line CL2 transistor from a low voltage signal to a high voltage turning off transistor 338. The transitioning of control lines CL1 and CL2 results in the voltage at node 342 being raised from the voltage of $V_{DD}$ to the voltage of $V_{PP}$. Because the voltage of $V_{PP}$ is approximately $V_{DD}$+0.2 volts to about $V_{DD}$+0.6 volts, it provides a greater voltage difference between lines SN and SP. This greater voltage difference enables the capacitor 302 to store electric charge more quickly. The more charge that is put onto capacitor 302 during the refresh cycle, the longer it will take for capacitor 302 to lose its charge enabling the frequency of the refresh cycle to be reduced. At time t=4, the write line WL transitions from a low voltage to a high voltage starting the transition from the read or refresh mode to the normal operating mode, which begins again at time t=5.

Figure 5:
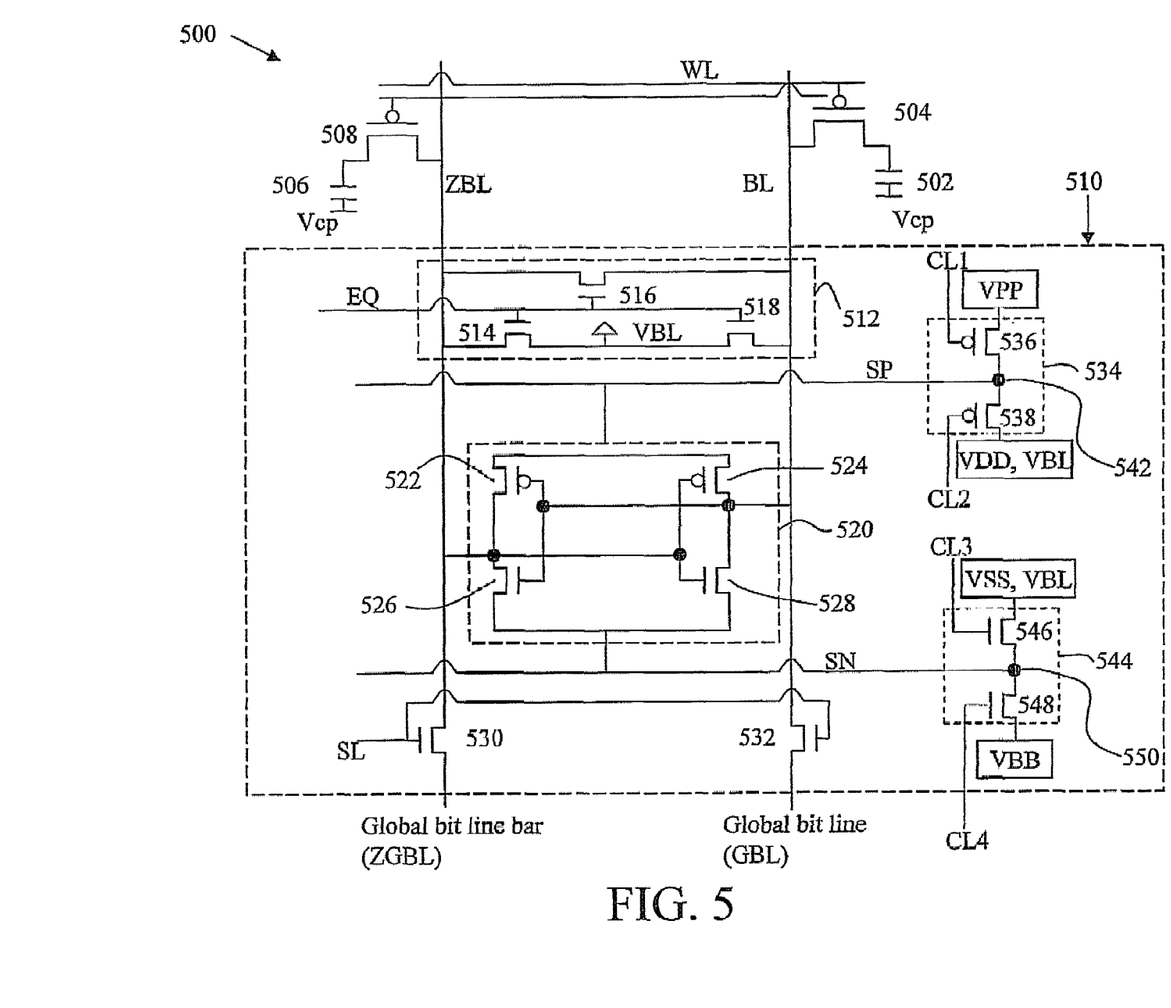
FIG. 5 illustrates another exemplary embodiment of a DRAM circuit.

FIG. 5 illustrates an exemplary DRAM circuit 500 according to another embodiment. With regards to FIGS. 3 and 5, like features in the two figures are indicated by a reference numeral in FIG. 5 having the same two least significant digits as the feature in FIG. 3, but increased by 200. For example, transistor 504 in FIG. 5 can be the same structure as transistor 304 in FIG. 3. DRAM circuit 500 includes a first storage bit 502 and a second storage bit 506. First storage bit 502 is coupled to a PMOS transistor 504, which is also coupled to bit line BL. Second storage bit 506 is coupled to a PMOS transistor 508, which is also coupled to the bit line bar ZBL. Sense amplifier 510 is connected to both the first storage bit 502 and second storage bit 506 via the bit line BL and the bit line bar ZBL, respectively. Sense amplifier 510 includes a pre-charge circuit 512, a back-to-back inverter 520 and two NMOS transistors 530 and 532. The gates of NMOS transistors 530 and 532 are coupled to the column selection line SL. Pre-charge circuit 512 includes three NMOS transistors 514, 516, 518, each having its gate coupled to the equalization line EQ.

Back-to-back inverter 520 includes two PMOS transistors 522 and 524 and two NMOS transistors 526 and 528. The gates of PMOS transistor 522 and NMOS transistor 526 are tied together and connected to both the bit line BL and the drains of PMOS transistor 524 and NMOS transistor 528, which are also tied together. The gates of PMOS transistor 524 and NMOS transistor 528 of back-to-back inverter 520 are tied together and connected to the bit line bar ZBL and the drains of PMOS transistor 522 and NMOS transistor 526, which are also tied together. The sources of PMOS transistors 522 and 524 are tied together and coupled to a switch 534 via line SP. Similarly, the sources of the NMOS transistors 526 and 528 are tied together and coupled to a switch 544 via line SN.

Switch 534 is operable between two voltage sources $V_{DD}$ and $V_{PP}$, which are both set to voltages higher than ground. In a preferred embodiment, $V_{PP}$ is set at a voltage approximately equal to $V_{DD}$+0.2 volts to about $V_{DD}$+0.6 volts. Switch 534 may be implemented through a variety of methods. In a preferred embodiment, switch 534 includes two PMOS transistors 536, 538 coupled together at a node 542. Node 542 is also connected to line SP as illustrated in FIG. 5. The gate of PMOS transistor 536 is coupled to control line CL1, and the gate of PMOS transistor 538 is coupled to control line CL2. When the DRAM circuit 500 is in the normal operating mode (i.e., retaining previously stored data, but not being written to, read from or refreshed). When word line WL is turned off (during the equalization time from t=0 to t=1), bit line BL, bit line bar ZBL, node SN, and node SP are pulled to $V_{BL}$. Also, all nodes of the back to back inverter 520 are pulled to $V_{BL}$. The PMOS transistors 536, 538 of switch 534 are off because the control lines CL1 and CL2 are set at a high voltage level. When a read or refresh sequence is performed, switch 534 is first configured so that the voltage of $V_{DD}$ is connected to node 542 and then a short time later is configured to connect the voltage of $V_{PP}$ to node 542 as discussed below.

The refreshing operation of a "1" in the first storage bit 502 of exemplary DRAM circuit 500 is now described. Initially, DRAM circuit 500 is in the normal operation state, in which it is retaining previously stored data, but is not reading, writing or refreshing a storage bit. In this mode, the equalization line EQ is high, which turns on NMOS transistors 514, 516 and 518 of the pre-charge circuit 512. This results in lines ZBL and BL being pre-charged with the voltage of $V_{BL}$. In a preferred embodiment, the voltage of $V_{BL}$ is set at approximately $0.5V_{DD}$ to $0.6V_{DD}$, although other voltages may be used. Also in this mode, switch 544 is configured to connect the voltage of $V_{SS}$ to line SN via node 550. The coupling of line SN with $V_{SS}$ is accomplished by having a high voltage signal on control line CL3 which turns on NMOS transistor 546, and having a low voltage signal on control line CL4, which turns off NMOS transistor 548. With NMOS transistor 546 on and NMOS transistor 548 off, the voltage of $V_{SS}$ develops at node 550.

Also in this state, line SP is floating by disconnecting SP from $V_{DD}$ and $V_{PP}$ by having high voltage signals on control lines CL1 and CL2. A high voltage signal on control line CL1 turns off PMOS transistor 536, and a high voltage signal on control line CL2 turns off PMOS transistor 538. When word line WL is turned off (during the equalization time from t=0 to t=1), bit line BL, bit line bar ZBL, node SN, and node SP are pulled to $V_{BL}$. Also, all nodes of the back to back inverter 520 are pulled to $V_{BL}$.

When the refresh of DRAM circuit 500 is initiated, line EQ is turned to the "off" state by connecting it to ground. This causes the voltages of BL and ZBL to float at approximately $V_{BL}$. Then, line WL is used to turn PMOS transistor 504 on, by transitioning it from a high voltage to a low voltage. However, alternative embodiments (not shown) utilize other transistors (instead of PMOS transistors) to couple capacitors 502 and 506 to lines BL and ZBL, respectively. When line WL transitions from high to low, PMOS transistor 504 turns on, and the voltage of the connected capacitor 502 begins to develop on bit line BL. Line SP is then coupled to $V_{DD}$ by transitioning the voltage signal on control line CL1 from a high voltage signal to a low voltage signal, turning on PMOS transistor 538. With $V_{DD}$ connected to line SP and $V_{SS}$ connected to line SN, the PMOS transistors 522, 524 and NMOS transistors 526, 528 of back-to-back inverter 520 turn on.

Shortly thereafter, control line CL1 transitions from a high voltage signal to a low voltage signal turning on PMOS transistor 536, and control line CL2 transitions from a low voltage signal to a high voltage signal turning off PMOS transistor 538. The transitioning of the voltages on control lines CL1 and CL2 raises the voltage at node 542, which is connected to line SP, from $V_{DD}$ to $V_{PP}$. At the same time, switch 546 changes its configuration and connects $V_{PP}$ to node 550 changing the voltage on line SN from the voltage of $V_{SS}$ to the voltage of $V_{BB}$. The orientation of switch 544 is changed by transitioning control line CL3 from a high voltage signal to a low voltage signal turning off NMOS transistor 544, and by transitioning control line CL4 from a low voltage signal to a high voltage signal to turn on NMOS transistor 548. With NMOS transistor 548 in the "on" state, the voltage of node 550 is pulled down to the voltage of $V_{BB}$.

Because the voltage of $V_{PP}$ is approximately $V_{DD}$+0.2V to about $V_{DD}$+0.6V, the voltage difference between line SN and line SP is greater than the voltage difference would be if line SP were coupled to $V_{DD}$. This enables line BL to more quickly transition down from $V_{BL}$ to a logic "1". In addition to line BL transitioning from $V_{BL}$ to a logic "1" state more quickly, more charge can be placed on capacitor 502. With more charge on capacitor 502, the "1" logic value stored in memory is more definite because a larger voltage difference exists between capacitor 502 and the pre-charge voltage $V_{BL}$. Accordingly, the more definite the "1" value in storage is, the less frequently the cell needs to be refreshed, because it takes longer for sufficient charge to leak onto the capacitor to result in an indefinite signal. Since the circuit needs to be refreshed less frequently, the power consumed by the circuit is reduced.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A DRAM circuit comprising:
   at least one memory cell comprising a capacitor coupled to a transistor; and
   at least one sense amplifier comprising a pre-charge circuit and a back-to-back inverter, the back-to-back inverter having at least one PMOS transistor and at least one NMOS transistor, wherein a source of the at least one NMOS transistor is coupled to a first voltage source set at ground and a source of the at least one PMOS transistor is coupled to first and second MOS transistors, the first MOS transistor configured to connect the source of the PMOS transistor to a second voltage source having a voltage that is a common supply voltage of the DRAM circuit and is higher than ground, the second MOS transistor configured to connect the source of the PMOS transistor to a third voltage source set at a higher voltage than the voltage of the second voltage source,
   wherein the first and second MOS transistors are configured to maintain the transistors of the back-to-back inverter in an off state during normal operation of the DRAM circuit by decoupling the source of the PMOS transistor from the second and third voltage sources.

2. The DRAM circuit as claimed in claim 1 wherein the third voltage source has a voltage approximately 0.2 volts to 0.6 volts higher than the voltage of the second voltage source.

3. The DRAM circuit as claimed in claim 1 wherein the back-to-back inverter further comprises a second PMOS transistor having a source coupled to the first and second MOS transistors.

4. The DRAM circuit as claimed in claim 3 wherein the back-to-back inverter further comprises a second NMOS transistor having a source coupled to the first voltage source.

5. The DRAM circuit as claimed in claim 4 wherein the pre-charge circuit includes at least one MOS transistor.

6. A DRAM circuit comprising:
   at least one memory cell; and
   at least one sense amplifier connected to the memory cell, the sense amplifier comprising:
      a pre-charge circuit connected to a first voltage source set at a voltage that is approximately one-half of a common supply voltage of the DRAM circuit; and
      a back-to-back inverter connected to the pre-charge circuit, the back-to-back inverter including a first PMOS transistor having a source, a second PMOS transistor having a source, a first NMOS transistor having a source, and a second NMOS transistor having a source, the sources of the first and second NMOS transistors are connected to a second voltage source set at approximately ground, and
      first and second MOS transistors, the first MOS transistor configured to connect the sources of the first and second PMOS transistors to a third voltage source set at the common supply voltage of the DRAM circuit during refresh operation to turn on the transistors of the back-to-back inverter, the second MOS transistor configured to connect the sources of the first and second PMOS transistors to a fourth voltage source having a higher voltage than the third voltage source during the refresh operation after the transistors of the back-to-back inverter have been turned on, the first and second MOS transistors are configured to maintain the sense amplifier in an off state during normal operation of the DRAM circuit by decoupling the source of the PMOS transistor from the second and third voltage sources.

7. The DRAM circuit of claim 6 wherein the third voltage source has a voltage that is approximately twice the voltage of the first voltage source, relative to ground.

8. The DRAM circuit of claim 7 wherein the pre-charge circuit comprises three MOS transistors.

9. The DRAM circuit of claim 6 wherein the fourth voltage source has a voltage about 0.2 volts to 0.6 volts higher than the voltage of the third voltage source.

10. A method of increasing the time between refreshing a DRAM circuit comprising the steps of:
    providing a DRAM circuit having a memory cell, a sense amplifier including a pre-charge circuit connected to a first voltage source set at a first voltage potential and a back-to-back inverter including a first NMOS transistor having a source, a second NMOS transistor having a source, a first PMOS transistor having a source, and a second PMOS transistor having a source;
    maintaining each of the transistors of the back-to-back inverter in an off state during normal operation of the DRAM circuit; and
    performing a refresh operation including:
       coupling the sources of the first and second PMOS transistors of the back-to-back inverter to a second voltage source set at a second voltage potential that is higher than the first voltage potential to transition the back-to-back transistor to an on state, and
       coupling the sources of the first and second PMOS transistors of the back-to-back inverter to a third voltage source to raise sources of the first and second PMOS transistors from the second voltage potential to a third voltage potential that is higher than the first and second voltage potentials.

11. The method of high speed sensing a DRAM circuit as claimed in claim 10 wherein the first voltage is a common supply voltage for the DRAM circuit that is set at a potential higher than ground.

12. The method of high speed sensing a DRAM circuit as claimed in claim 10 wherein the second voltage is approximately 0.2 volts to 0.6 volts higher than the first voltage.

13. The method of high speed sensing a DRAM circuit as claimed in claim 12 wherein the DRAM circuit further includes first and second MOS transistors for respectively coupling the sources of the first and second PMOS transistors to the second voltage source and to the third voltage source.

14. The DRAM circuit of claim 1 wherein the normal operation of the DRAM circuit is when the DRAM circuit is not performing a read, a refresh, or a write operation.

15. The DRAM circuit of claim 6 wherein the normal operation of the DRAM circuit is when the DRAM circuit is not performing a read, a refresh, or a write operation.

16. The method of claim 10 wherein the normal operation of the DRAM circuit is when the DRAM circuit is not performing a read, a refresh, or a write operation.

* * * * *

UNITED STATES PATENT AND TRADEMARK OFFICE
CERTIFICATE OF CORRECTION

PATENT NO. : 7,663,908 B2
APPLICATION NO. : 11/684803
DATED : February 16, 2010
INVENTOR(S) : Hang Cheng, Chen-Hui Hsieh and Chun-Cheng Chou It is certified that error appears in the above-identified patent and that said Letters Patent is hereby corrected as shown below:

Column 8, line 26, Claim 6, after "during" insert -- a --.

Signed and Sealed this

Twentieth Day of April, 2010

David J. Kappos
*Director of the United States Patent and Trademark Office*